United States Patent
Offermans et al.

(10) Patent No.: US 10,830,696 B2
(45) Date of Patent: Nov. 10, 2020

(54) DETECTOR DEVICE WITH PHOTOCONDUCTIVE BODY

(71) Applicants: IMEC vzw, Leuven (BE); Stichting IMEC Nederland, Eindhoven (NL)

(72) Inventors: Peter Offermans, Zaltbommel (NL); Joris Van Campenhout, Brussels (BE)

(73) Assignees: IMEC vzw, Leuven (BE); Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 16/200,352

(22) Filed: Nov. 26, 2018

(65) Prior Publication Data

US 2019/0204216 A1 Jul. 4, 2019

(30) Foreign Application Priority Data

Dec. 29, 2017 (EP) .................................... 17211053

(51) Int. Cl.

| | |
|---|---|
| *G01N 21/3586* | (2014.01) |
| *G01J 3/42* | (2006.01) |
| *G02B 6/122* | (2006.01) |
| *G01J 5/28* | (2006.01) |
| *G02B 6/12* | (2006.01) |
| *G01J 5/10* | (2006.01) |

(Continued)

(52) U.S. Cl.
CPC ........ *G01N 21/3586* (2013.01); *G01J 1/0407* (2013.01); *G01J 1/44* (2013.01); *G01J 3/0205* (2013.01); *G01J 3/42* (2013.01); *G01J 5/0818* (2013.01); *G01J 5/0837* (2013.01); *G01J 5/10* (2013.01); *G01J 5/28* (2013.01); *G02B 6/12* (2013.01); *G02B 6/1228* (2013.01); *H01L 31/09* (2013.01); *G02F 2203/13* (2013.01)

(58) Field of Classification Search
CPC .......... G01J 1/0407; G01J 1/44; G01J 3/0205; G01J 3/42; G01J 5/0818; G01J 5/0837; G01J 5/10; G01J 5/28; G01N 21/3586; G02B 6/12; G02B 6/1228; G02F 2203/13; H01L 31/09
See application file for complete search history.

(56) References Cited

U.S. PATENT DOCUMENTS

| 9,804,026 B2 | 10/2017 | Jarrahi et al. |
| 2003/0007719 A1 | 1/2003 | Forrest et al. |

(Continued)

OTHER PUBLICATIONS

Extended European Search Report dated Jul. 10, 2018 issued in EP 17211053.8 filed Dec. 29, 2017.

*Primary Examiner* — Marcus H Taningco
(74) *Attorney, Agent, or Firm* — Knobbe, Martens, Olson & Bear, LLP

(57) ABSTRACT

A solid-state device for photo detection, in general, of terahertz radiation is disclosed. One aspect is a detector device comprising a body having a photoconductive material, a first antenna element connected to a first portion of the body, and a second antenna element connected to a second portion of the body. The first antenna element and the second antenna element are arranged to induce an electric field in the body in response to an incident signal. Further, the device has a waveguide arranged to couple light into the photoconductive material via a coupling interface between the waveguide and the body, where the coupling interface faces away from the first portion and the second portion of the body and is closer to the first portion than to the second portion.

14 Claims, 5 Drawing Sheets

(51) Int. Cl.
*G01J 5/08* (2006.01)
*G01J 1/04* (2006.01)
*G01J 1/44* (2006.01)
*G01J 3/02* (2006.01)
*H01L 31/09* (2006.01)

(56) References Cited

U.S. PATENT DOCUMENTS

| | | |
|---|---|---|
| 2009/0225311 A1* | 9/2009 | Umetsu ................ G01J 3/0208 356/317 |
| 2011/0215246 A1* | 9/2011 | Kajiki .................... G02F 1/353 250/338.4 |
| 2012/0097850 A1 | 4/2012 | Darcie et al. |
| 2014/0103211 A1 | 4/2014 | Darcie et al. |
| 2014/0346357 A1* | 11/2014 | Jarrahi .................... H01L 31/09 250/338.4 |
| 2015/0102222 A1 | 4/2015 | Kim et al. |
| 2015/0372159 A1 | 12/2015 | Englund et al. |
| 2016/0091776 A1 | 3/2016 | Mohammed et al. |
| 2016/0209268 A1 | 7/2016 | Lee et al. |
| 2016/0320573 A1 | 11/2016 | Lee et al. |

* cited by examiner

DETECTOR DEVICE WITH PHOTOCONDUCTIVE BODY

CROSS-REFERENCE TO RELATED APPLICATIONS

This application claims foreign priority to European Patent Application No. 17211053.8, filed Dec. 29, 2017, the contents of which are incorporated by reference herein in its entirety.

BACKGROUND

Technological Field

The disclosed technology generally relates to photodetectors. In particular, the disclosed technology relates to a solid-state structure for photo detection of terahertz (THz) radiation (i.e., electromagnetic waves at frequencies in the terahertz range).

Description of the Related Technology

Photodetectors are utilized in a number of applications, e.g., imaging, sensing and communication using electromagnetic waves within the terahertz frequency range. Photodetectors are known to operate in photoconductive mode based on photo induced generation of charge carriers (i.e., electrons, holes or electron-hole pairs or excitons) that give rise to a current that can be detected in the photodetector.

A photoconductive antenna-coupled detector may comprise a photoconductive semiconductor element that is biased by an antenna and pumped by a pulsed or heterodyned optical pump to detect a pulsed or continuous-wave terahertz signal, respectively. The optical pump gives rise to electron-hole pairs in the photoconductor, while the incident signal, received by the antenna, induces an electrical field in the photoconductor. The electrical field causes the photo-generated carriers to drift to a respective contact electrode, thus generating an output photocurrent proportional to the intensity of the received signal.

It is appreciated that the performance of the detector, among other parameters, is related to the carrier lifetime of the photoconductor material. The design of such a detector may therefore be the result of trade-off considerations of the advantages and disadvantages with short carrier lifetimes and long carrier lifetimes, respectively.

A short carrier life-time allows for detection of higher terahertz frequencies as carrier life-time induced roll-off is reduced. This is however associated with a reduction in photocurrent. Long life-time photoconductors, on the other hand, suffer from life-time roll-off already at lower frequencies, whereas their mobility can be much larger than that of short life-time photoconductors. This may lead to higher photocurrents at lower frequencies. In long life-time photoconductors however, the impedance of the antenna is typically larger than the time-averaged photo conductance of the photoconductor, such that only a small portion of the induced terahertz voltage at the antenna will appear across the photoconductor.

Thus, long carrier life-time photoconductors may offer higher detector responsivity levels, while short carrier life-time photoconductors tend to be more suitable for low-noise detector operation. It is therefore desirable to provide a detector device having an improved performance in terms of both responsivity and noise.

SUMMARY OF CERTAIN INVENTIVE ASPECTS

It is an object of the disclosed technology to provide a detector device having improved performance. Additional and alternative objects may be understood from the following.

According to an aspect of the disclosed technology, there is provided a detector device having a body comprising a photoconductive material, a first antenna element connected to a first portion of the body and a second antenna element connected to a second portion of the body. The first antenna element and the second antenna element are arranged to induce an electric field in the body in response to an incident signal. Further, the detector device comprises a waveguide arranged to couple light into the photoconductive material via a coupling interface between the waveguide and the body, wherein the coupling interface is oriented to face away from the first portion and the second portion, and is arranged closer to the first portion than to the surface portion of the body. The detector device also comprises an electrode pair arranged to allow a photocurrent to be measured, the photocurrent resulting from the induced electrical field and the light coupled into the body.

As used herein, "incident signal" may refer to radiation to be detected by the detector, such as electromagnetic radiation. In particular, the electromagnetic radiation may have a frequency within the terahertz (THz) range (i.e., 0.1-10 THz). Terahertz radiation is known to be non-ionising and to have a sufficiently low energy to, in general, not harm biological tissue and DNA. Terahertz radiation may also penetrate fabrics and plastics, making many optically opaque materials transparent or semi-transparent at terahertz frequencies. The fact that terahertz radiation may penetrate into most non-conductive materials and yet be blocked by metallic objects makes terahertz radiation useful for security screening and detecting hidden weapons, for example. Further, terahertz radiation may be used in communication applications, such as wireless data transmission at improved speed, for example.

Terahertz detectors (or receivers or antennae; the terms may be used interchangeably in the present disclosure) may utilize a heterodyne technology, in which a received continuous wave signal is mixed with a reference frequency signal and down-converted to an intermediate frequency signal that can be detected and analyzed, for example, by components developed for radio frequency (RF) technologies.

The photoconductive material may be understood as a material having the capability of becoming more electrically conductive due to absorption of electromagnetic radiation or light. Examples of photoconductors may, for example, be based on GaAs and InGaAs. The absorbed radiation causes the number of charge carriers of the material to increase and thereby increase the electrical conductivity of the material. In the context of the present application, a waveguide is used for coupling light into the photoconductive body to increase the number of charge carriers in the material. This may be referred to as "pumping" or "optically pumping" of the body, and the light (or electromagnetic radiation) used for achieving the pumping may be a continuous wave or a pulsed signal depending on the type of terahertz signal to detect.

The first antenna element and the second antenna element may also be referred to as an antenna. An antenna should, in the present context, be understood as a structure capable of biasing the photoconductive body (i.e., generating an electrical field in the body) in response to the incident signal. The antenna elements may be directly connected to the body (i.e., arranged in direct contact with a surface of the body), or indirectly by means of a contact structure. Thus, it is appreciated that the term "connected" to the body may include contact structures arranged between the antenna elements and the body. Examples of such contact structures may include plugs and vias, formed, for example, by doped regions of the material of the body itself and/or metal contact structures. The contact structures may be vertically oriented and/or laterally oriented depending on the specific architecture and layout. Vertical contact structures may, for example, be employed to arrange the antenna elements in a layer that differs from the layer in which the body is arranged, such that the antenna elements in some examples may be arranged in a layer above the body.

In some embodiments, the first and second antenna elements may be arranged at the same side of the body and spaced apart to define an active region in which the induced electrical field may cause the photo-generated charge carrier of the photoconductive material to drift. The drifting charge carriers may be referred to as an induced photocurrent.

The photo-generated charge carrier may drift towards a respective electrode of the electrode pair, thereby allowing the photocurrent to be measured. In some embodiments, the electrode pair may be structurally integrated with, or at least electrically connected with, an antenna element. Alternatively, the electrodes may form an antenna structure.

The waveguide may be formed of a material capable of transmitting and coupling light into the body of the detector device. According to the disclosed technology, the waveguide is arranged to couple the light via a coupling interface between the waveguide and the body, facing away from the first and second portion of the body, at which the antenna elements may be arranged or connected to the body. The coupling may, for example, comprise a direct coupling into a surface of the body, or an evanescent coupling. Further, the waveguide is arranged to couple light into the body at a position that is closer to the first portion than to the second portion of the body. This arrangement may also be referred to as an asymmetrical pumping of the body, and may be understood as a contrast to symmetric pumping, in which the body may be evenly illuminated along the entire distance between the first and second antenna elements. Thus, according to some of the disclosed embodiments, the light may be coupled into the body at only a part of a surface extending between the first and second antenna element (or between portions of the body to which the antenna elements are connected), wherein that portion is arranged closer to a first one of the antenna elements than to a second one of the antenna elements (or contact portions between the antenna elements and the body).

In some examples, the position at which the light is coupled into the photoconductive body may define an active region of the body. In other words, the active region may be construed as the region of the body in which photo-induced charge carrier are generated. The active portion may also, in case the first portion and the second portion of the body are doped, be referred to as the intrinsic or undoped portion of the body. By the present arrangement of the waveguide, the coupling interface or the active region may be asymmetrically arranged with respect to the antenna elements (or the interface between the contact portions of the antenna elements and the body).

The asymmetric coupling of light into the photoconductive body allows for an overall conductance between the first and second antenna element to consist of a part that is due to the illumination and a dark part. This may result in an average photoconductor impedance that is much larger than the antenna impedance, thereby allowing for the major portion of the induced voltage at the antenna to appear across the photoconductor rather than the antenna. Advantageously, this allows for improved photocurrents and, therefore, improved signal-to-noise ratio of detectors combined with a long carrier lifetime above, for example, 1 ns (i.e., photoconductive materials having a relatively high conductance).

The use of a waveguide, which, for example, may be formed of crystalline Si, allows for the light to be more precisely focused at the desired entering point of the photoconductive body as compared to free-space illuminated detectors (i.e., detectors not using any waveguides). The waveguide is advantageous in that it may improve the lateral confinement of the light, which may allow for a reduced width of the photoconductive body and hence a reduced transit time to the electrodes. Further, arranging the waveguide to couple light into a surface or coupling interface that faces away from the first and second portions of the body, at which the antenna element are arranged or connected to the body, may allow for a reduced device cross-section compared to free-space illuminated devices.

The disclosed technology facilitates integration in photonic integrated circuits, such as, for example, Si/Ge-based photonic circuits, comprising passive structures such as waveguides, and active structures such as, for example, Ge photodiodes. Germanium based photoconductors tend to have a conductivity that is too high for THz detection. This drawback is addressed by the disclosed technology, in which the lower conducting dark regions, which is achieved by the asymmetric pumping, contributes to an overall reduction of the conductivity. The use of the waveguide allows for the detector device to be directly integrated with the photonic circuit. This is a more cost efficient and less complex solution than prior art technologies using, for example, germaniums slabs that are arranged on the photonic chip and excited by a grating coupler. Such technologies often require flip chip or die bonding processes.

Further, aspects of the disclosed technology allow for the length of the optical absorption path to be adjusted or optimized independently from the cross section of the device. At the same time, the distance between the antenna elements, or contacts, can be reduced or minimized to optimize capacitive and transit time roll-off. This differs from certain other technologies, such as, free space technologies not using a waveguide, in which the thickness of the photoconductive material, for example, a Ge slab, may determine the length of the absorption path.

According to some embodiments, the first portion and the second portion may form part of an interface between the respective antenna element and the body. Further, the first portion and the second portion may be formed of a first and second doped region of the body, respectively, wherein an intrinsic or undoped region may be arranged there between. Depending on the orientation of the respective regions, the interface between a doped region and the intrinsic region may be oriented in a lateral direction, a vertical direction or a combination thereof. Further, the coupling interface may form part of a side surface of the body. The body may hence be formed as a three-dimensional body, such as, for example, a cuboid, having a top portion (relative to a substrate, from which the top portion may face away) and one or more lateral or side portions. The contact portions of the first and second antenna element (i.e., the location on the body in which the antenna elements are connected) may define a gap in which the electric field may be induced during operation. Consequently, the waveguide may be arranged to couple in light from the lateral side, at a position not coinciding with a center or middle of the gap.

According to an embodiment, the detector may comprise at least two waveguides arranged to couple light into the photoconductive material from opposing sides. This arrangement allows for light that is not absorbed in the body to be reflected back into the waveguides. Additionally, or alternatively the light may be circulated in a closed loop manner, in which the light may be coupled into the body through a first one of the waveguides and exit the body through a second one of the waveguides. The opposing sides may, for example, be the lateral portions of a three-dimensional body, having a top portion to which the antenna may be coupled. Thus, the at least two waveguides may be arranged to couple light into and/or out from the body along an axis intersecting a first lateral surface, or side surface, and a second lateral surface, or side surface, of the body.

According to an embodiment, the electrode pair may be arranged to allow the photocurrent to be measured in one or more directions intersecting the axis. In other words, light may be entering the body from two sides and at a position of the gap being closer to a first one of the portions of the body than to a second one of the portions of the body, which in turn may be arranged to induce an electric field across the gap. Thus, the field may in some examples be orthogonal to the axis (i.e., the direction from which the light or optical pump may be provided).

According to an embodiment, the waveguide may be provided with a light confinement structure, such as a tapered confinement structure, for confinement of the optical mode of the input light. The improved confinement allows for the optical input power to be localized on a specific side of the device, thereby achieving asymmetric illumination for device cross-sections with widths down to, for example, 1 µm. The light confinement structure may, for example, be formed of polycrystalline silicon.

According to an embodiment, the body may comprise a photodiode, such as, for example, a Ge diode. The diode may behave as a capacitor to its built-in electric field between the oppositely doped contacts, thereby resulting in a relatively low conductivity. Further, the photodiode may be pre-biased so as to compensate for photocurrents present also in absence of a THz field.

It is noted that the disclosed technology relates to all possible combinations of features recited in the claims. Further objectives of, features of, and advantages with the disclosed technology will become apparent when studying the following detailed disclosure, the drawings, and the appended claims. Those skilled in the art will realize that different features of the disclosed technology can be combined to create embodiments other than those described in the following.

BRIEF DESCRIPTION OF THE DRAWINGS

The above, as well as additional objects, features and advantages of the disclosed technology, will be better understood through the following illustrative and non-limiting detailed description of embodiments of the disclosed technology, with reference to the appended drawings.

Figure 1:
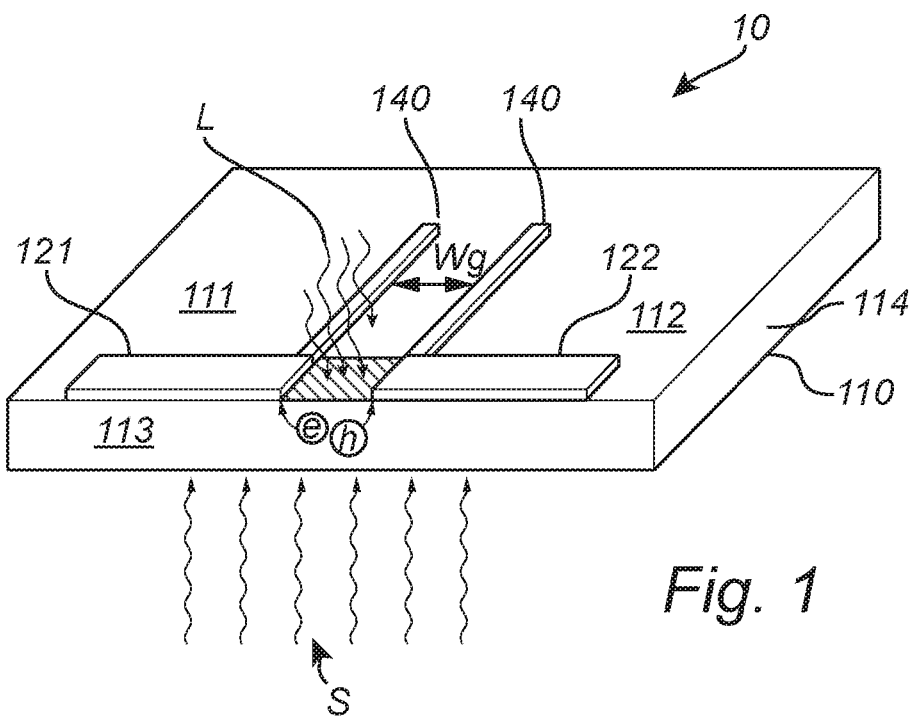
FIGS. 1 and 2 show perspective views of a detector device according to an example.

As illustrated in the figures, the sizes of the elements, features and other structures may be exaggerated or not depicted proportionally for illustrative purposes. Thus, the figures are provided to illustrate the general elements of the embodiments and examples.

In the drawings, like reference numerals will be used for like elements unless stated otherwise.

DETAILED DESCRIPTION OF CERTAIN ILLUSTRATIVE EMBODIMENTS

Figure 2:
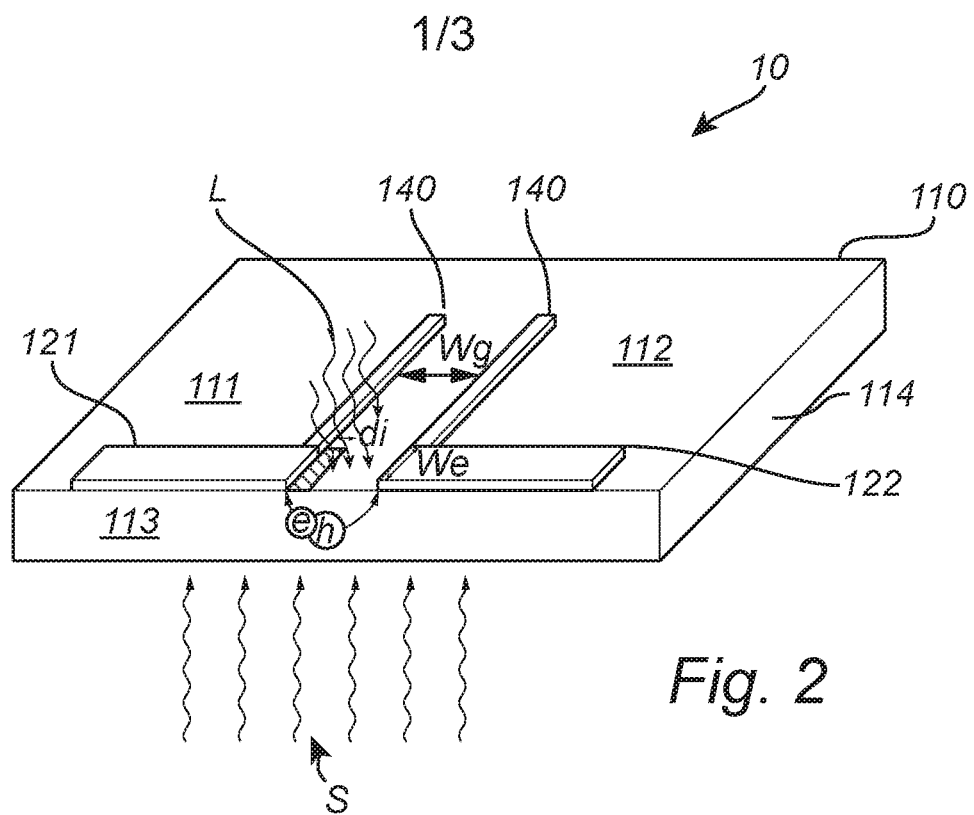

The general operation of an optically pumped photoconductive detector according to the disclosed technology will be discussed in connection with FIGS. 1 and 2, showing a detector device 10 having a body 110, an antenna pair 121, 122 and an electrode pair 140.

The photodetector 10 may utilize a photo mixing method, in which the incident signal S to be detected (e.g., an electromagnetic signal within the terahertz wavelength range) is combined with a pumped signal L for generating a photo induced current in the body 110 of the detector 10. The pumped signal L may be generated, for example, by an optical pump providing light (e.g., a laser) that is coupled into the material of the body 110 to generate photo induced charge carriers forming a current that can be detected or measured by the electrode pair 140.

As illustrated in FIGS. 1 and 2, the body 110 may comprise a first surface portion 111 and a second surface portion 112, which both may form part of a top surface of the body 110, and lateral surfaces or side surfaces 113, 114 facing away from the top surface. The body 110 comprises a photoconductive material, for example based on GaAs or InGaAs, which is capable of generating charge carriers (such as electrons and holes) upon interaction with the optical signal L. The material of the body 110 may, in some examples, be selected to be invisible to the signal S, such that it may pass, for example, relatively unaffected through the material towards the antenna elements 121, 122.

The antenna may comprise a first antenna element 121 and a second antenna element 122 arranged on the first surface portion 111 and the second surface portion 112, respectively. The antenna elements 121, 122 may, for example, be formed of an electrode material deposited on a surface of the body 110. As shown in FIGS. 1 and 2, the antenna elements 121, 122 may be arranged spaced apart from each other to define a gap W, over which an electric field or electric potential difference may be induced as the antenna elements 121, 122 interact with the incident electromagnetic signal S.

The detector 10 may further comprise electrodes 140 for measuring the electrical current, or potential difference, that is induced in the material of the body 110 as the electric field interacts with the charge carriers. The electrodes 140 may be electrically connected to the antenna elements 121, 122, or in some examples structurally integrated with the antenna elements 121, 122.

FIG. 1 illustrates an example of a symmetric detector architecture in which the body 110 is symmetrically pumped (i.e., in which the light L is coupled into the body 110 through the entire surface extending in the gap W between the first antenna element 121 and the second antenna element 122). Other examples of symmetric pumping may include coupling light into only a portion of the surface in the gap, wherein the portion is symmetrically arranged over a center of the gap W.

FIG. 2 illustrates an example of the asymmetric architecture employed by the disclosed technology, in which the pumping light L is coupled into the body 110 at a position that is located off-center in relation to the middle of the gap W. The remaining portion of the gap W may be left unilluminated (i.e., dark). In this example, only a small width d of the gap W may be illuminated. This portion may be arranged closer to a first one of the antenna elements (e.g., the first antenna element 121), than to a second one of the antenna elements (e.g., the second antenna element 122). In FIG. 2, the illuminated portion d is arranged adjacent to the first antenna element 121. The asymmetric illumination of the active region of the photoconductor body 110 (i.e., the gap W) helps maintain an average photoconductor impedance that is much larger than the antenna impedance. This is advantageous for detection of THz radiation, as it enables the major portion of the induced THz voltage at the receiving antenna 121, 122 (as measured by means of the electrode pair 140) to appear across the photoconductor active region. If the impedance of the photoconductive region were smaller than the antenna impedance, there is a risk that the THz induced voltage would drop only over the antenna rather than over the photoconductive gap W.

Figure 3:
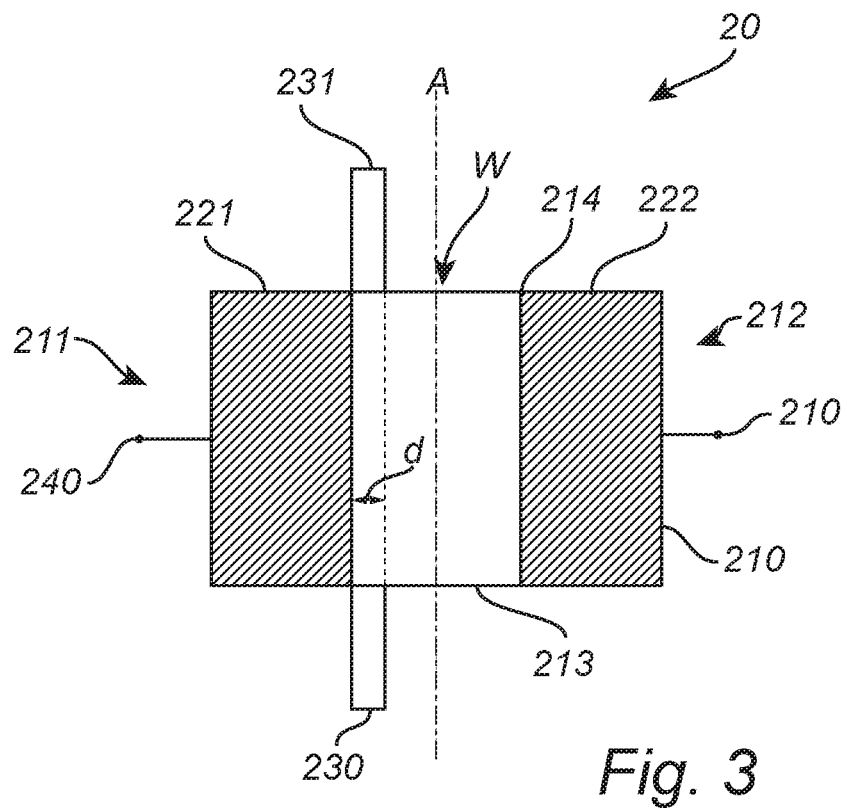
FIG. 3 shows a top view of a detector device according to an embodiment.
Figure 4:
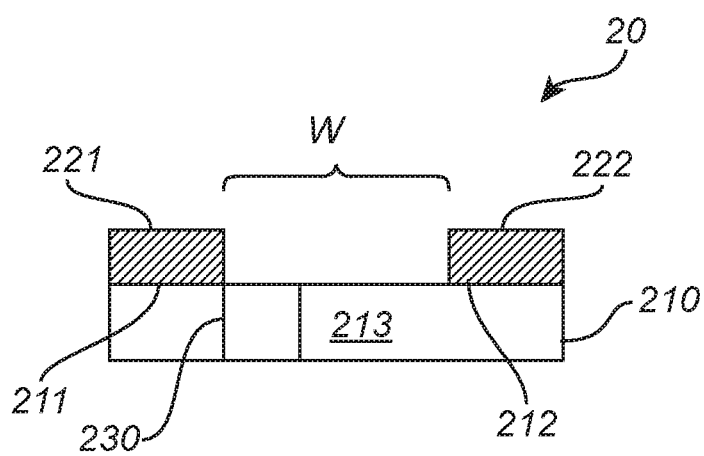
FIG. 4 shows a side view of the detector device of as disclosed in FIG. 3.

With reference to FIGS. 3 and 4, a detector device according to some embodiments of the disclosed technology will now be discussed. In addition to the examples of FIGS. 1 and 2, the present embodiments comprise an optical waveguide 230 for coupling the light L, or pump signal, into the body 210 of the detector 20. Similar to the previously described examples, the detector may comprise a photoconductive body 210 having a first surface portion 211, a second surface portion 212 and a third surface portion 214, wherein a first antenna element 221 may be arranged to contact the first surface portion 211, a second antenna element 222 arranged to contact the second surface portion 212, and a waveguide 230 arranged to form a coupling interface at the third surface portion 213. The third surface portion 213 is arranged to face away from the first surface portion 211 and the second surface portion 212.

According to the illustrated exemplary embodiment, the body 210 of the detector device 20 may form a three-dimensional body 210 having a top portion, of which the first and second surface portions 211, 212 form part, and lateral surfaces (or side portions) of which the third surface portion 213 forms part. Thus, in this example the antenna elements 221, 222 may be arranged directly on the top surface of the body 210 and the light L (i.e., the optical pumping of the photoconductor) may be coupled into the photoconductive material from the portion 213 of the body 210. Depending on the position on the third surface portion 213, in which the light L is coupled into the body 213, an asymmetric pumping may be achieved with reference to a center of the gap W. In FIG. 3, the center of the photoconductive gap W is illustrated by the axis A, extending along the gap W and intersecting the lateral side surfaces 213, 214 of the body 210.

This specific arrangement is illustrated in FIG. 4, which is a side view of the device shown in FIG. 3. In FIG. 4, the first antenna element 221 and the second antenna element 222 are arranged spaced apart to define a photoconductive gap W, over which the antenna 221, 222 may induce an electric field upon interaction with the incident radiation signal S (not shown). In this configuration, the antenna elements 221, 222 and the gap W are arranged at the top surface of the body 210, whereas the waveguide 230 is arranged at the side surface 213 of the body 210. The waveguide 230, which, for example, may be formed of Si, may thus be arranged to illuminate a small portion of the photoconductor material of the body 210, such as a portion corresponding to the width d of the active region.

Figure 5:
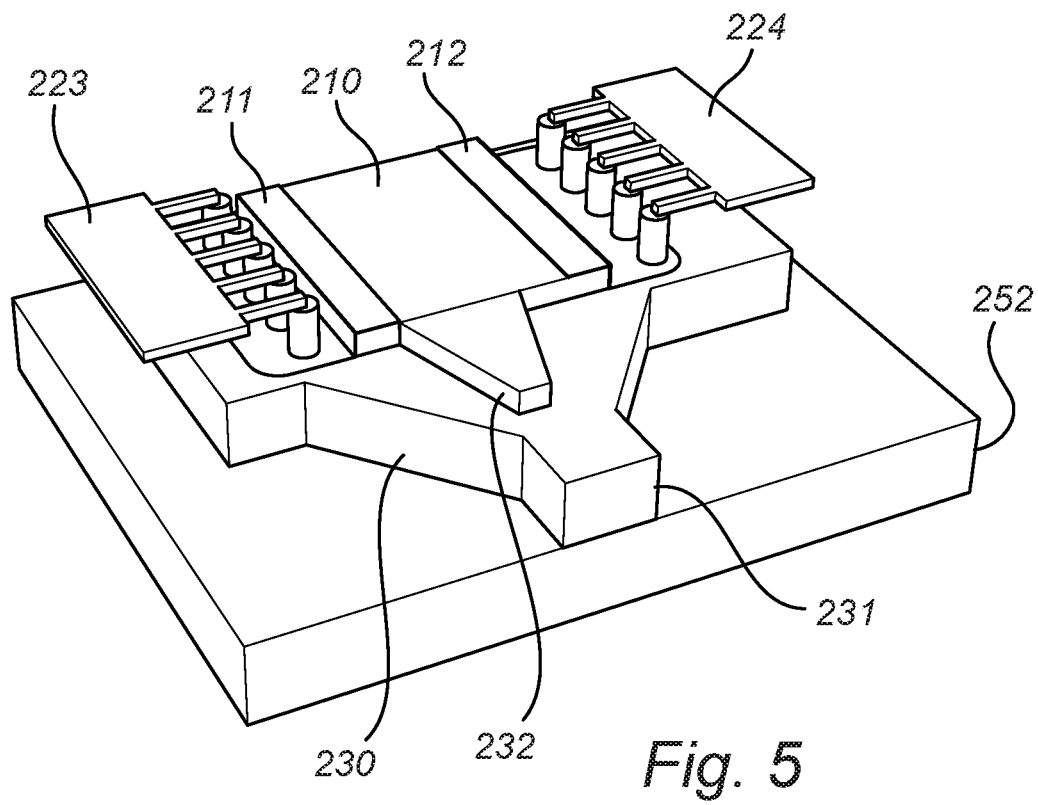
FIG. 5 shows a perspective view of a detector device according to an embodiment.

FIG. 5 is a perspective view of a detector device 20 according to an embodiment, in which a tapered waveguide structure 230 is provided on a substrate material 252. The waveguide structure 230 may for example be formed of silicon. On top of the waveguide structure 230, a photoconductive body 210 may be arranged. In some embodiments, the body may comprise germanium. The body 210 may be formed as a waveguide having a top portion facing away from the substrate 252 (and underlying portions of the waveguide structure 230) and lateral portions, or side surfaces, facing away from the surface of the top portion. The body 210 may further comprise a first and a second doped portion 211, 212, which may be arranged, for example, at a respective side portion of the body 210 and define an undoped or intrinsic portion in between. The doped portions 211, 212 may in some examples be n-doped, so as to provide an increased electrical conductivity. Each one of the first and second portions 211, 212 may be electrically connected to a contact structure 223, 224, such as, for example, by contact plugs or vias, extending between the first and second portions 211, 212 and the respective antenna elements (not shown) arranged above the body 210. In this example, the antenna elements may be formed of, for example, a copper layer arranged above the layers of the waveguide 230 and the body 210 and connected to the first and second portions of the body through the contact structures 223, 224. Thus, the antenna elements 221, 222 may be indirectly connected to the body 210 via the contact structures 223, 224, instead of arranged directly on a surface of the body 210. However, they may still be arranged to contact a portion of the body facing away from the substrate 252 and the side portions of the body 210.

The waveguide 230 may further comprise a taper structure 232 arranged on top of the waveguide 230 and such that light can be coupled into the body 210 through a coupling interface at a side portion of the body 210. The taper structure 232 may have a width that is gradually increased towards the coupling interface so as to guide light into the body 210. As illustrated in FIG. 5, the taper structure 232 may be arranged in an asymmetrical manner relative to the position of the first and second portions 223, 224, such that the coupling interface is arranged closer to the first portion 223 than to the second portion 224. The taper structure 232 may have a shape adapting the taper structure 232 to a waveguide mode matching the mode of the waveguide structure 230, such that both structures 230, 232 together may form a coupling waveguide. During operation, light may be entered into the waveguide structure 230 at an interface surface 231, and coupled into the body 210 via the coupling interface between the side portion of the body 210 and the coupling waveguide 230, 232.

Figure 6:
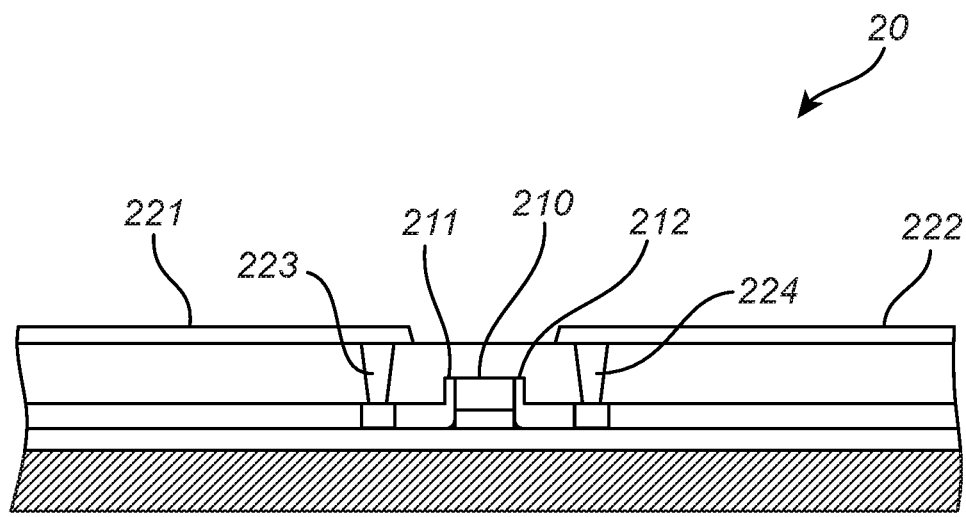
FIG. 6 shows a cross sectional view of the detector device of FIG. 5.

FIG. 6 is a cross sectional view of the device shown in FIG. 5, taken along the active region in the direction of the measured photocurrent. As illustrated in the present example, the contact structures 223, 234 for contacting the antenna elements 221, 222 with the photoconductive body 210 may be formed by ion implanting regions of the silicon material of the waveguide 230 (the taper structure defining the coupling interface for coupling light into the body 210 is not shown in this cross section). The doping may also be performed on the first side portion 211 and the second side portion 212 of the body 210, such that the doped regions of the silicon waveguide are in electrical contact with the first and second side portions 211, 212 and thus the photoconductive body 210. The first and second antenna elements 221, 222, which may be arranged in a level higher up in the stack forming the detector device 20, may be electrically connected to the body 210 by means of via connections 223, 224 which for example may extend in a vertical direction. Thus, the antenna elements 221, 222 may be connected to the photoconductive body 210 at a respective interface between the doped regions 211, 212 and intrinsic region of the body 210. The interface may in some examples be arranged in a vertical direction with respect to the substrates 250, 252 of the detector device 20.

According to an exemplifying example of the disclosed technology, the photoconductive body 210 may be formed of a plate having a thickness of 0.16 μm and a width (as seen in the direction of the gap over which the electric field may be induced during operation) of about 0.5 μm or less. The body 210 may be connected to an antenna structure, of which each antenna element 221, 222 may have a length of about 10-200 μm. The antenna elements may be arranged in a metal layer, which may be separated from the remaining structures of the detector device 20 by an isolating layer 260.

It will be appreciated that the detector device 20 according to the disclosed technology may employ more than one waveguide for providing a desired optical pumping of the photoconductive body 210. One example is shown in FIG. 3, in which a further waveguide 231 is arranged at a further side portion 214, which in this example is a lateral portion 214 opposing the coupling interface 213. Both waveguides 230, 231 may be aligned with each other to provide an improved pumping of the portion of the gap W arranged closest, or adjacent to the first antenna element 221.

With reference to FIGS. 7a-i, an exemplifying process for manufacturing a detector device according to an embodiment will be disclosed. The resulting detector device may be similarly configured as the embodiments discussed in connection with the previous figures.

Figure 7A:
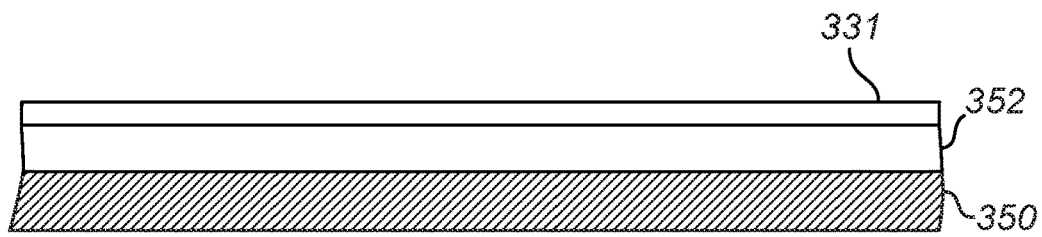
FIGS. 7*a-i* show cross sectional view of a detector device at different stages of a manufacturing process.
Figure 7B:
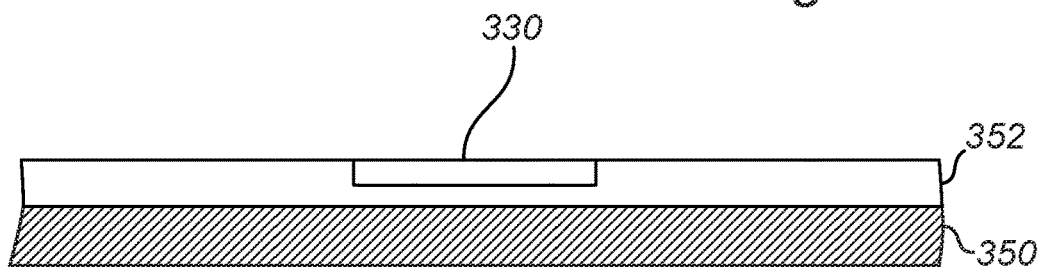

Hence, according to FIG. 7a, a silicon-on-insulator (SOI) wafer may be provided, comprising a stack of a substrate layer 350, a buried oxide (BOX) layer 352 and an upper silicon layer 331. The upper silicon layer 331 may be the layer of which the waveguide structure 330 is formed, as indicated in FIG. 7b. The waveguide structure 330, which in this example is formed of silicon, may be formed by patterning of the silicon layer 330, etching, oxide deposition and planarization.

Figure 7C:
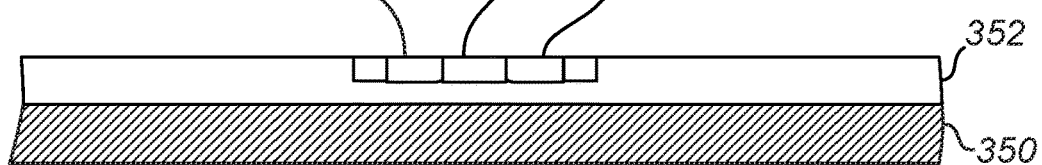

Subsequently, the waveguide structure 330 may be doped by means of implantation, as shown in FIG. 7c. The resulting structure may comprise two doped regions 325, 326 arranged on opposite sides of an intrinsic, or undoped, region 330. The doped regions 325, 326 may form the contact regions at which the antenna elements (not shown) may be connected to the body of the detector device.

Figure 7D:
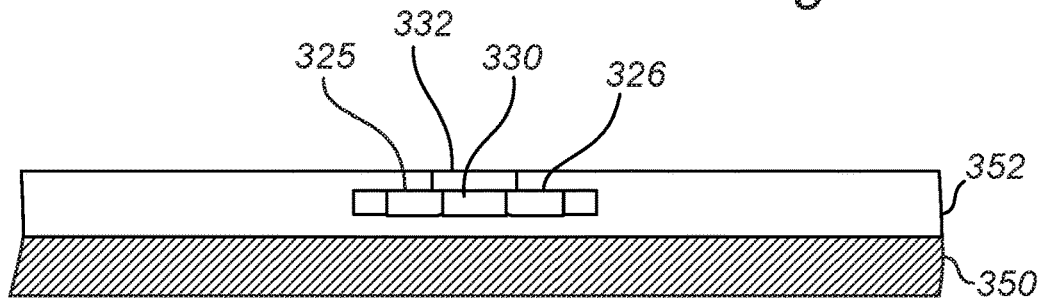

Subsequently, a polysilicon layer 332 is deposited and patterned, forming the tapered waveguide and a sacrificial adjacent part, as shown in FIG. 7d. The sacrificial part of the polysilicon 332 layer may be replaced by germanium in the next step, for example.

Figure 7E:
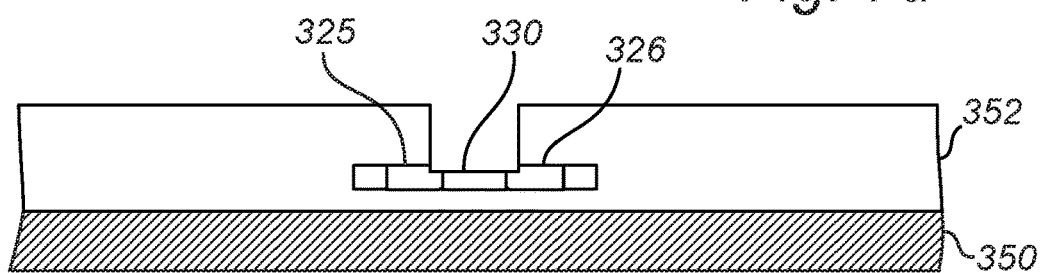
Figure 7F:
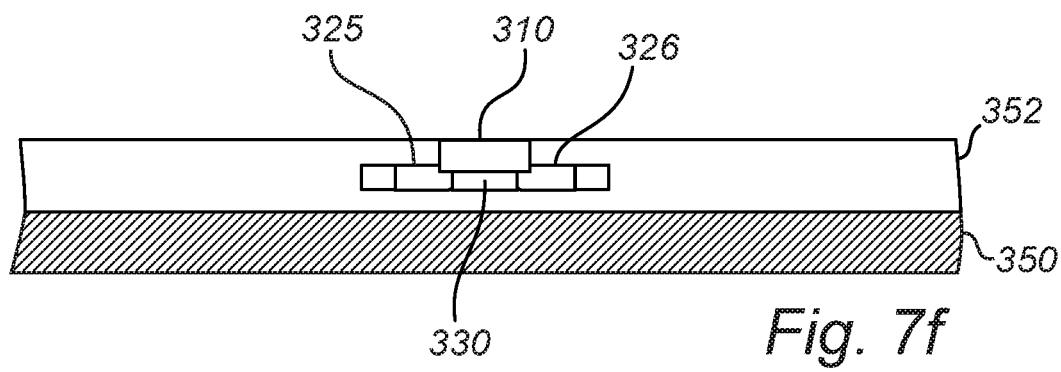
Figure 7G:
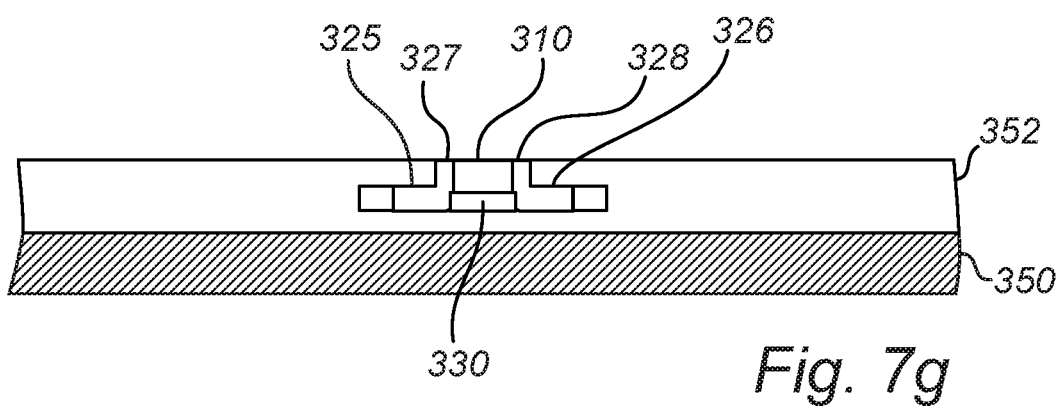

In FIG. 7e, an oxide has been deposited on the stack and provided with an opening, by which the sacrificial polysilicon part is etched together with the top part of the underlying silicon layer of the waveguide structure 330. In this opening, a photoconductive body 310 of, for example, germanium may be selectively grown, followed by a planarization as indicated in FIG. 7f. The germanium body 310 may then be implanted, as shown in FIG. 7g. The doping may be performed in a similar manner as the two doped regions 325, 326, resulting in an intrinsic region arranged between two doped contact regions 327, 328. The interface between the doped regions 327, 328 and the intrinsic portion of the body 310 may define the gap or active region of the body 310, over which an electric field may be induced by the antenna elements connected to the doped regions 325, 326 of the waveguide structure 330.

Figure 7H:
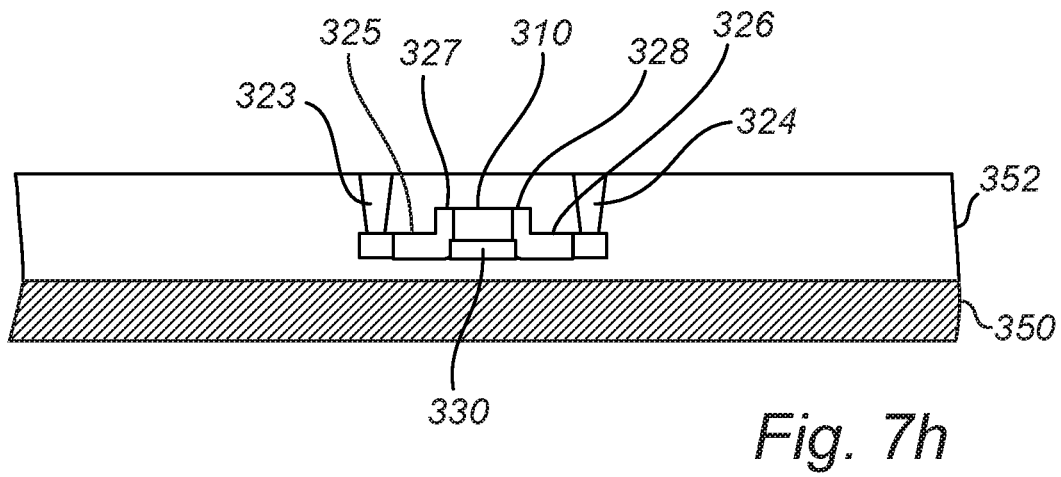
Figure 7I:
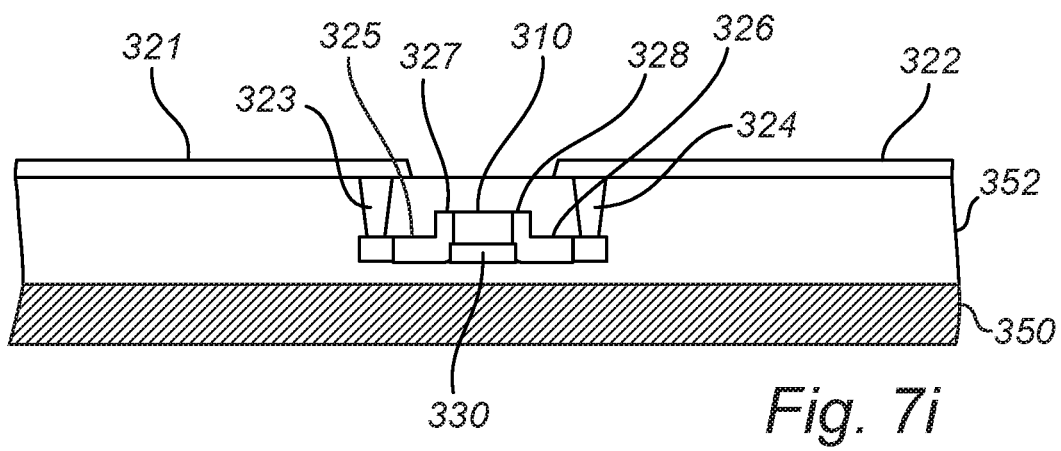

FIG. 7h illustrates the device after via connections 323, 324 have been formed, which extend from the doped regions 325, 326 of the waveguide structure 330 up to a higher level of the stack. These via connections 323, 324 may be used for connecting the first and second antenna elements 321, 322 to the photoconductive body 310, as shown in FIG. 7i.

In the above, the disclosed technology has mainly been described with reference to a limited number of examples. However, as is readily appreciated by a person skilled in the art, other examples than the ones disclosed above are equally possible within the scope of the disclosed technology, as defined by the appended claims.

What is claimed is:

1. A detector device of electromagnetic radiation, comprising:
   a body comprising a photoconductive material;
   a first antenna element connected to a first portion of the body and a second antenna element connected to a second portion of the body, wherein the first antenna element and the second antenna element are arranged to induce an electric field in the body in response to an incident signal;
   a waveguide arranged to couple light into the photoconductive material via a coupling interface between the waveguide and the body, the coupling interface facing away from the first portion and the second portion of the body and being closer to the first portion than to the second portion; and
   an electrode pair arranged to allow a photocurrent to be measured, the photocurrent resulting from the induced electrical field and the light coupled into the body.

2. The detector device according to claim 1, wherein the first portion and the second portion form part of a top portion of the body, and wherein the coupling interface forms part of a side portion of the body.

3. The detector device according to claim 1, wherein the first portion and the second portion are formed of a respective doped region of the body, and wherein an intrinsic region is arranged between the first portion and the second portion.

4. The detector device according to claim 3, wherein the light is coupled into the intrinsic region at a position arranged off-center with respect to a center axis of the intrinsic region.

5. The detector device according to claim 4, wherein the electrode pair is arranged to allow the photocurrent to be measured in a direction intersecting the center axis.

6. The detector device according to claim 1, further comprising at least two waveguides arranged to couple light into the photoconductive material from opposing sides of the body.

7. The detector device according to claim 6, wherein the at least two waveguides are arranged to couple light into the body along an axis intersecting a first side surface and a second side surface of the body.

8. The detector device according to claim 1, wherein the waveguide has a tapered light confinement structure.

9. The detector device according to claim 1, wherein the first antenna element and the second antenna element are indirectly connected to the first portion and the second portion, respectively, by via connections.

10. The detector device according to claim 1, wherein the body comprises a photodiode.

11. The detector device according to claim 1, wherein the received incident signal is a terahertz signal.

12. A detector device of electromagnetic radiation, comprising:
- a body comprising a photoconductive material;
- a first antenna element connected to a first portion of the body and a second antenna element connected to a second portion of the body, wherein the first portion and the second portion are formed of a respective doped region of the body, wherein an intrinsic region is arranged between the first portion and the second portion, and wherein the first antenna element and the second antenna element are arranged to induce an electric field in the body in response to an incident signal;
- a waveguide arranged to couple light into the photoconductive material via a coupling interface between the waveguide and the body, the coupling interface facing away from the first portion and the second portion of the body and being closer to the first portion than to the second portion; and
- an electrode pair arranged to allow a photocurrent to be measured, the photocurrent resulting from the induced electrical field and the light coupled into the body.

13. The detector device according to claim 12, wherein the light is coupled into the intrinsic region at a position arranged off-center with respect to a center axis of the intrinsic region.

14. The detector device according to claim 12, wherein the electrode pair is arranged to allow the photocurrent to be measured in a direction intersecting the center axis.

* * * * *